(12) United States Patent  
Siegle et al.

(10) Patent No.: US 7,498,805 B2
(45) Date of Patent: Mar. 3, 2009

(54) MAGNETORESISTIVE LAYER SYSTEM AND SENSOR ELEMENT HAVING THIS LAYER SYSTEM

(75) Inventors: Henrik Siegle, Leonberg (DE); Maik Rabe, Wannweil (DE); Ulrich May, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 21 days.

(21) Appl. No.: 10/519,968

(22) PCT Filed: Jun. 26, 2003

(86) PCT No.: PCT/DE03/02134

§ 371 (c)(1),
(2), (4) Date: Dec. 30, 2004

(87) PCT Pub. No.: WO2004/017085

PCT Pub. Date: Feb. 26, 2004

(65) Prior Publication Data

US 2005/0270022 A1    Dec. 8, 2005

(30) Foreign Application Priority Data

Jul. 26, 2002   (DE) ................... 102 34 349
Dec. 2, 2002    (DE) ................... 102 56 246

(51) Int. Cl.
*G01R 33/09*  (2006.01)
*G01R 33/05*  (2006.01)
(52) U.S. Cl. ............... 324/252; 324/207.21; 324/249
(58) Field of Classification Search ............... 324/252, 324/207.21; 360/324, 325, 324.1, 324.11, 360/324.12, 324.2
See application file for complete search history.

(56) References Cited

U.S. PATENT DOCUMENTS

| | | | |
|---|---|---|---|
| 5,206,590 A | | 4/1993 | Dieny et al. |
| 5,432,734 A | * | 7/1995 | Kawano et al. ............. 365/158 |
| 5,686,838 A | * | 11/1997 | van den Berg ............. 324/252 |
| 6,111,782 A | * | 8/2000 | Sakakima et al. ........... 365/158 |
| 6,144,534 A | * | 11/2000 | Xue et al. ............. 360/327.31 |
| 6,351,357 B1 | | 2/2002 | Dolejsi et al. |
| 6,633,466 B2 | * | 10/2003 | Sakaguci et al. ....... 360/327.31 |
| 6,690,553 B2 | * | 2/2004 | Iwasaki et al. ......... 360/324.12 |

(Continued)

FOREIGN PATENT DOCUMENTS

DE    4243358    6/1994

(Continued)

OTHER PUBLICATIONS

Phys. Rev. Lett., 84, (2000), p. 1816 and p. 3462.

(Continued)

*Primary Examiner*—Bot LeDynh
(74) *Attorney, Agent, or Firm*—Kenyon & Kenyon LLP

(57) ABSTRACT

A magnetoresistive layer system, in an environment of a magnetoresistive layer stack that works particularly on the basis of the GMR effect or the AMR effect, a layer array being provided which generates a magnetic field which acts upon the magnetoresistive layer stack, and the layer array having at least one hard magnetic layer and at least one soft magnetic layer. Furthermore, a sensor element, particularly for the detection of magnetic fields with respect to their strength and/or direction, having such a layer system.

10 Claims, 2 Drawing Sheets

U.S. PATENT DOCUMENTS

2001/0036045 A1* 11/2001 Kondo ..................... 360/322
2002/0076579 A1    6/2002 Hanawa et al.
2002/0164828 A1* 11/2002 Ishiwata et al. ............... 438/3
2003/0112564 A1*  6/2003 Granstrom ............ 360/324.12
2004/0121185 A1*  6/2004 Fukuzawa et al. ........... 428/692

FOREIGN PATENT DOCUMENTS

| | | |
|---|---|---|
| DE | 69019242 | 9/1995 |
| DE | 19820465 | 11/1998 |
| DE | 199 49 713 | 5/2001 |
| DE | 101 28 135 | 12/2002 |
| GB | 2 360 875 | 10/2001 |
| JP | 9-282612 | 10/1997 |

OTHER PUBLICATIONS

IEEE Trans. Magn., 27, (1991), p. 3588-3600.

* cited by examiner

MAGNETORESISTIVE LAYER SYSTEM AND SENSOR ELEMENT HAVING THIS LAYER SYSTEM

This is a 371 national phase application of PCT/DE03/02134 filed 26 Jun. 2003, which claims priority to German Patent Applications No. 102 34 349.7 filed 26 Jul. 2002 and No. 102 56 246.6 filed 2 Dec. 2002, the contents of which are incorporated herein by reference.

BACKGROUND INFORMATION

Magnetoresistive layer systems or sensor elements are known from the related art, whose operating point, for example, for use in motor vehicles, is shifted by auxiliary magnetic fields generated in various ways. In particular, the generation of such auxiliary magnetic fields by mounted macroscopic hard magnets or by field coils having current flowing through them is known. Besides that, German Patent Application No. DE 101 28 135.8 explains a concept in which a hard magnetic layer is deposited in the vicinity of a magnetoresistive layer stack, especially on or under the layer stack, which, above all, because of its stray field, couples into the actual sensitive layers. In this context, a coercivity that is as high as possible is foremost as target parameter and, on the other hand, the remanent magnetic field is foremost as limiting parameter. Furthermore, such a hard magnetic layer, in a vertical integration, effects an electrical short circuit of the adjacent sensitive layers of the magnetoresistive layer system, which limits a desired GMR effect or AMR effect, as well as the sensitivity of the layer system with respect to outer magnetic fields.

It is an object of the present invention to provide a possibility of cost-effectively and simply generating a magnetic bias field or auxiliary magnetic field which acts upon a magnetoresistive layer stack, so as thereby being able to produce magnetoresistive sensor elements, especially for use in motor vehicles, in an inexpensive and yet reliable manner.

SUMMARY OF THE INVENTION

The magnetoresistive layer system according to the present invention has the advantage, compared to the related art, that an increased magnetic stray field is made available at a simultaneously increased coercivity or coercive field strength, via the layer positioning provided in an environment of the magnetoresistive layer stack working particularly on the basis of the GMR effect or the AMR effect, the layer equipment being simply and cost-effectively generated or integrated into the layer system. In particular, the layer system has a very thin type of construction, above all with respect to the thickness of the hard magnetic layer.

Besides that, it is of advantage that the layer system offers the possibility, within a certain scope, of varying the strength of the stray field generated by the hard magnetic and the soft magnetic layer, and that the particularly thin soft magnetic layer, which is coupled into the hard magnetic layer or is positioned adjacent to it, prevents the demagnetization of the hard magnetic layer in response to the application of an outer magnetic alternating field by domain stray fields (so-called creeping), as is described in Phys. Rev. Lett., 84, (2000), page 1816 and page 3462.

By the way, a system made of a hard magnetic and a soft magnetic state generally has a higher magnetization as compared to a purely hard magnetic layer, i.e. a higher magnetic moment per volume. Because of that, at the same total thickness, the field strength of the magnetic stray field of a layer system increases with a hard magnetic and a soft magnetic layer, which are, in particular, ferromagnetically exchange coupled, compared to the field strength of only a hard magnetic layer.

Thus, in the case of a ferromagnetic exchange coupled layer system having at least one soft magnetic and at least one hard magnetic layer, upon the application of an outer magnetic field having an orientation deviating from the direction of magnetization, the soft magnetic layer advantageously demonstrates a chiral magnetization which returns to an alignment parallel to the hard magnetic magnetization when the outer field is switched off, as is described in IEEE Trans. Magn., 27, (1991), page 3588. In particular, the magnetization of the soft magnetic layer is coherently rotated, and is not demagnetized by domain nucleation. Consequently, stray fields of other or additional soft magnetic layers (domain stray fields) are not able to demagnetize the hard magnetic layer at a small distance.

Moreover, the concept of the construction of the magnetoresistive layer system may be adapted without problem to existing magnetoresistive sensor elements or layer systems having GMR multilayers, magnetoresistive sensor elements or layer systems according to the spin valve principle, AMR sensor elements or even sensor elements based on granular magnetoresistors or magnetoresistances brought about by structural changes of material properties, or may be integrated into appropriate production processes. The deposition of the individual layer of the layer system is not critical, in this context, compared to known influential factors.

DETAILED DESCRIPTION

Figure 2:
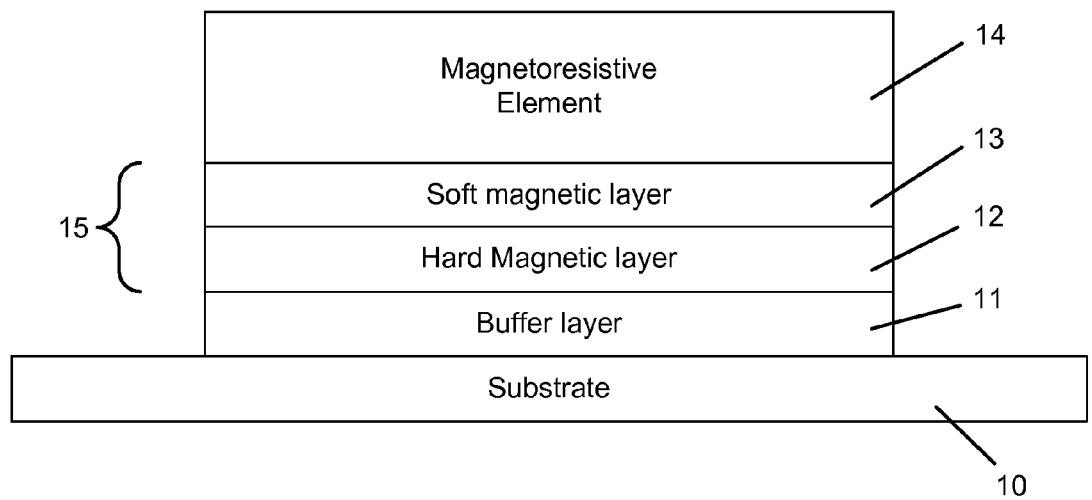
FIG. 2 shows a section through a magnetoresistive layer system on a substrate.

FIG. 2 shows a substrate 10, made, for example, of silicon or silicon oxide, upon which, above an optionally present buffer layer 11, made, for example, of Cr, W or Mo, there is a hard magnetic layer 12, and on the hard magnetic layer 12 there is a soft magnetic layer 13. These two layers 12, 13 form a layer system 15.

On soft magnetic layer 13, a magnetoresistive layer stack 14 is provided that is known per se, and preferably works on the basis of the GMR effect ("giant magnetoresistance") or the AMR effect ("anisotropic magnetoresistance"). Preferably layer stack 14 has a plurality of individual layers which work on the principle of coupled multilayers or the spin valve principle. Layer stack 14 and layer system 15 are thus vertically integrated, and together form a magnetoresistive layer system 5. Furthermore, magnetoresistive layer stack 14 may also be made up of a CMR material ("colossal magnetoresistance"), such as $La_{0.67}Ca_{0.33}MnO_3$. In this case, magnetoresistive layer stack 14 has a material in which a structural change ("Jahn-Teller effect") may be induced by a magnetic field or also a temperature change, which effects an electrical transition of the material from a conductor or metal to an insulator. Thereby changes in the electrical resistance of more than 100% may appear. Moreover, by such a CMR material, there is also understood powder magnetoresistance ("PMR") in which a magnetoresistance between individual granular magnetic parts having different magnetizations is generated.

Preferably, a ferromagnetic exchange coupled, thin, soft magnetic layer 13 is deposited on hard magnetic layer 12. In this context, one makes use of the fact that, in a certain layer thickness range, soft magnetic layer 13 ensures both an increased coercivity and an increased amount of the magnetic stray field of layer system 15. In particular, in relation to a comparable layer thickness of a purely hard magnetic layer, soft magnetic layer 13 increases the amount of the stray field overproportionately corresponding to the high saturation magnetization of soft magnetic layer 13.

This permits designing layer system 15 to have a layer 11, 12 that is in each case ferromagnetic, but on one hand soft magnetic and on the other hand hard magnetic, at the same stray field to be generated and the same or greater coercivity, to be thinner than a purely hard magnetic layer would be designed, using corresponding parameters. This decreased thickness increases the electrical resistance of layer system 15, and therewith the GMR effect or the AMR effect in magnetoresistive layer stack 14, which also leads to an improved sensitivity of layer system 5 in response to a measurement of the magnetic fields acting upon it from the outside.

By the way, the comparatively expensive hard magnetic materials of hard magnetic layer 12 are a relevant cost factor compared to the comparatively inexpensive soft magnetic materials of soft magnetic layer 13, i.e. the production costs for layer system 15 are reduced by the use of soft magnetic layer 13. In addition, soft magnetic layer 13 prevents demagnetization of hard magnetic layer 12 when there is an outer magnetic alternating field.

Preferably, according to FIG. 2, a soft magnetic layer 13 made of a CoFe alloy such as $Co_{90}Fe_{10}$, Co, Fe, Ni, an FeNi alloy such as $Fe_{18}Ni_{81}$ as well as magnetic alloys containing these materials is deposited on or below hard magnetic layer 12, to have a thickness between 1 nm and 50 nm, via which, as was explained, properties of layer system 15 are adjustable. Preferably soft magnetic layer 13 has a thickness of 1 nm to 10 nm. The hard magnetic layer is preferably made of a CoCrPt alloy such as $Co_{75}Cr_{13}Pt_{12}$, a CoSm alloy such as $Co_{80}Sm_{20}$, a CoCr alloy such as $Co_{80}Cr_{20}$, a CoCrTa alloy such as $Co_{84}Cr_{13}Ta_3$, a CoPt alloy such as $Co_{50}Pt_{50}$ or an FePt alloy such as $Fe_{50}Pt_{50}$. The thickness of hard magnetic layer 12 is preferably between 20 nm and 100 nm.

Preferably, soft magnetic layer 13 is located between magnetoresistive layer stack 14 and hard magnetic layer 12.

Alternatively to the example explained with the aid of FIG. 2, a plurality of especially differently composed soft magnetic layers 13 and/or soft magnetic layers 13 of different thickness may be provided, which are located under, or preferably, according to FIG. 2, on hard magnetic layer 12, and which preferably each have a thickness between 1 nm and 50 nm, particularly 1 nm to 10 nm, and are made of the aforementioned materials. Furthermore, layer system 15 may also be constructed of multilayers of a plurality of soft magnetic layers 13 and hard magnetic layers 12, having layer pairs corresponding to FIG. 2.

What these variants have in common is that the ferromagnetic coupled soft magnetic and hard magnetic layers 12, 13 are always deposited as double layers or multilayers in the vicinity of magnetosensitive layer stack 14.

What is technologically advantageous, because it is particularly simple to implement, is the already mentioned deposition of layer system 15 underneath or above layer stack 14. However, layer system 15 may alternatively also be situated on one side or on both sides next to layer stack 14, or even be integrated into layer stack 14.

Figure 1:
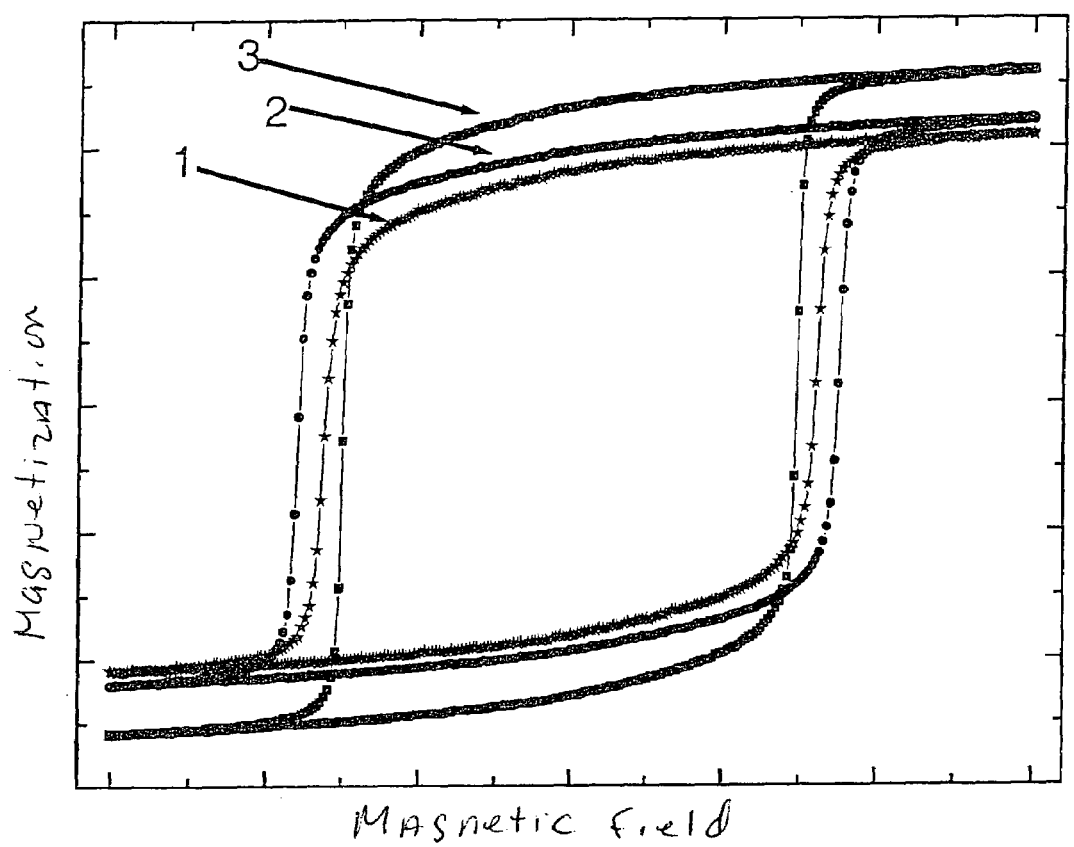
FIG. 1 shows magnetization curves of variously constructed layer arrays in comparison.

FIG. 1 shows a first magnetization curve 1, i.e. the strength of magnetization as a function of a magnetic field, for an exclusively hard magnetic layer, a second magnetization curve 2 for this hard magnetic layer having a thin soft magnetic layer applied to it, and a third magnetization curve 3 for this hard magnetic layer having soft magnetic layer applied to it that is thicker compared to curve 2. In this context, the magnetization is the sum of the magnetic moments, i.e. an increased magnetization also means an increased field strength of the stray field.

One may infer from FIG. 1 that layer system 15, depending on the choice of layer thickness of the soft magnetic layer, has an increased coercivity compared to purely hard magnetic layer 12, and an increased remanent magnetization. This is based on the fact that soft magnetic layer 13 generates a comparatively great stray field, based on the great magnetic moment of the materials forming it, and that the coupling of soft magnetic layer 13 into hard magnetic layer 12 aligns this great magnetic moment in the direction of the magnetization of hard magnetic layer 12. Thereby is yielded overall a high field strength of the stray field.

What is claimed is:

1. A magnetoresistive layer system comprising:
   a magnetoresistive layer stack that works substantially on the basis of one of a GMR effect and an AMR effect;
   a layer array for generating a magnetic field which acts upon the magnetoresistive layer stack, the layer array situated at least one of (a) on and (b) below a magnetoresistive region of the magnetoresistive layer stack and including at least one hard magnetic layer and at least one soft magnetic layer, the at least one soft magnetic layer being adjacent to the at least one hard magnetic layer;
   wherein the layer array has a plurality of soft magnetic layers and a plurality of hard magnetic layers, which are combined into layer pairs having a hard magnetic layer and an adjacent soft magnetic layer.

2. The magnetoresistive layer system according to claim 1, wherein the hard magnetic layer and the soft magnetic layer are ferromagnetically exchange coupled.

3. The magnetoresistive layer system according to claim 1, wherein the soft magnetic layer is composed of a CoFe alloy, Co, Fe, Ni, an FeNi alloy, and magnetic alloys which contain these materials.

4. The magnetoresistive layer system according to claim 1, wherein the soft magnetic layer has a thickness between 1 nm and 50 nm.

5. The magnetoresistive layer system according to claim 4, wherein the thickness is between 1 nm and 10 nm.

6. The magnetoresistive layer system according to claim 1, wherein the hard magnetic layer is composed of one of a CoCrPt alloy, a CoSm alloy, a CoCr alloy, a CoCrTa alloy, a CoPt alloy, and an FePt alloy.

7. The sensor element according to claim 1, wherein the at least one soft magnetic layer is a thin layer deposited onto the at least one hard magnetic layer.

8. A magnetoresistive layer system comprising:
   a magnetoresistive layer stack that works substantially on the basis of one of a GMR effect and an AMR effect;
   a layer array for generating a magnetic field which acts upon the magnetoresistive layer stack, the layer array situated at least one of (a) on and (b) below a magnetoresistive region of the magnetoresistive layer stack and including at least one hard magnetic layer and at least one soft magnetic layer, the at least one soft magnetic layer being adjacent to the at least one hard magnetic layer;
   wherein a thickness of the hard magnetic layer is between 20 nm and 100 nm.

9. A sensor element comprising:
a magnetoresistive layer system, in an environment of a magnetoresistive layer stack that works substantially on the basis of one of a GMR effect and an AMR effect, the magnetoresistive layer system including:
a layer array for generating a magnetic field which acts upon the magnetoresistive layer stack, the layer array situated at least one of (a) on and (b) below a magnetoresistive region of the magnetoresistive layer stack and including at least one hard magnetic layer and at least one soft magnetic layer, the at least one soft magnetic layer being adjacent to the at least one hard magnetic layer;
wherein the at least one soft magnetic layer is a thin layer deposited onto the at least one hard magnetic layer.

10. The sensor element according to claim 9, wherein the sensor element is for detecting magnetic fields with respect to at least one of strength and direction.

* * * * *